United States Patent
Roy et al.

(10) Patent No.: US 6,395,610 B1
(45) Date of Patent: May 28, 2002

(54) METHOD OF MAKING BIPOLAR TRANSISTOR SEMICONDUCTOR DEVICE INCLUDING GRADED, GROWN, HIGH QUALITY OXIDE LAYER

(75) Inventors: Kumar Pradip Roy; Ranbir Singh, both of Orlando, FL (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/597,909

(22) Filed: Jun. 20, 2000

Related U.S. Application Data

(60) Provisional application No. 60/140,666, filed on Jun. 24, 1999, and provisional application No. 60/140,909, filed on Jun. 24, 1999.

(51) Int. Cl.$^7$ ............................................. H01L 21/331
(52) U.S. Cl. ....................... 438/354; 438/322; 438/325
(58) Field of Search ................................. 438/354, 305, 438/307, 308, 770, 909

(56) References Cited

U.S. PATENT DOCUMENTS

| | | |
|---|---|---|
| 4,277,320 A | 7/1981 | Beguwala et al. ........... 204/164 |
| 4,518,630 A | 5/1985 | Grasser ........................ 427/93 |
| 4,851,370 A | 7/1989 | Doklan et al. |
| 5,089,441 A | 2/1992 | Moslehi |
| 5,153,701 A | 10/1992 | Roy ............................. 357/54 |
| 5,334,556 A * | 8/1994 | Guldi ........................ 438/308 |
| 5,371,394 A | 12/1994 | Ma et al. ..................... 257/335 |
| 5,514,608 A | 5/1996 | Williams et al. |
| 5,567,638 A | 10/1996 | Lin et al. .................... 438/592 |
| 5,619,052 A | 4/1997 | Chang et al. |
| 5,622,607 A | 4/1997 | Yamazaki et al. ........... 204/192 |
| 5,629,221 A | 5/1997 | Chao et al. .................. 438/591 |
| 5,707,888 A | 1/1998 | Aronowitz et al. |

(List continued on next page.)

FOREIGN PATENT DOCUMENTS

EP 0 323 071 5/1989 ......... H01L/21/316

OTHER PUBLICATIONS

Cramer et al., Sodium passivation dependence on phosphorous concentration in tetraethylorthosilicate plasma-enhanced chemical vapor deposited phosphosilicate glasses, J. Appl. Phys. 73 (5), Mar. 1, 1993, p. 2458–2461.

Kraft et al., Surface nitridation of silicon dioxide with a high density nitrogen plasma, J. Vac. Sci. Technol. B 15(4), Jul./Aug. 1997, p. 967–970.

(List continued on next page.)

*Primary Examiner*—David Nelms
*Assistant Examiner*—Dung Anh Le
(74) *Attorney, Agent, or Firm*—Allen, Dyer, Doppelt, Milbrath & Gilchrist, P.A.

(57) ABSTRACT

A bipolar transistor includes an oxide layer having graded portions with greatly reduced stress on a silicon substrate. The method of making the oxide preferably includes growing a first oxide portion by upwardly ramping the silicon substrate to a first temperature lower than a glass transition temperature, and exposing the silicon substrate to an oxidizing ambient at the first temperature and for a first time period. Also, the method includes growing a second oxide portion between the first oxide portion and the silicon substrate by exposing the silicon substrate to an oxidizing ambient at a second temperature higher than the glass transition temperature for a second time period. The second oxide portion may have a thickness in a range of about 2 to 75% of a total thickness of the graded, grown, oxide layer. The step of upwardly ramping preferably includes upwardly ramping the temperature at a relatively high ramping rate to reduce any oxide formed during the upward ramping. Thus, an improved oxide is provided and has the desired electrical characteristics in terms of a low interface trap site density, resistance to hot carrier aging, and improved time dependent dielectric breakdown (TDDB), for example.

16 Claims, 5 Drawing Sheets

U.S. PATENT DOCUMENTS

| | | | |
|---|---|---|---|
| 5,739,580 A | 4/1998 | Aronowitz et al. | 257/647 |
| 5,757,204 A | 5/1998 | Nayak et al. | 324/769 |
| 5,814,562 A | 9/1998 | Green et al.. | 438/708 |
| 5,821,158 A | 10/1998 | Shishiguchi | 438/528 |
| 5,851,892 A * | 12/1998 | Lojek et al. | 438/305 |
| 5,863,831 A | 1/1999 | Ling et al. | 438/515 |
| 5,877,057 A | 3/1999 | Gardner et al. | 438/301 |
| 5,885,870 A | 3/1999 | Maiti et al. | 438/261 |
| 5,891,809 A | 4/1999 | Chau et al. | 438/770 |
| 5,913,149 A | 6/1999 | Thakur et al. | 438/762 |
| 5,918,137 A | 6/1999 | Ng et al. | 438/454 |
| 5,926,741 A | 7/1999 | Matsuoka et al. | 438/778 |
| 5,968,279 A | 10/1999 | MacLeish et al. | 134/1.2 |
| 5,972,804 A | 10/1999 | Tobin et al. | 438/786 |
| 6,008,128 A | 12/1999 | Hubuka et al. | 438/695 |
| 6,020,247 A | 2/2000 | Wilk et al. | 438/398 |
| 6,029,680 A | 2/2000 | Hawthorne et al. | 134/1.3 |
| 6,069,062 A | 5/2000 | Downey | 438/528 |
| 6,083,836 A | 7/2000 | Rodder | 438/690 |
| 6,086,815 A | 7/2000 | Tsai et al. | 438/585 |
| 6,180,454 B1 | 1/2001 | Chang et al. | 438/257 |
| 6,222,233 B1 | 4/2001 | D'Anna | 257/343 |
| 6,281,140 B1 | 8/2001 | Chen et al. | 438/763 |
| 6,281,559 B1 | 8/2001 | Yu et al. | 257/407 |

OTHER PUBLICATIONS

Chatterjee et al., Sub–100nm Gate Layer Metal Gate NMOS Transistors Fabricated by a Replacement Gate Process, IDEM Tech. Dig., p. 821–824 (1997).

Hattangady et al. Ultrathin nitrogen–profile engineered gate dielectric films.

Hattangady et al., Remote Plasma Nitirded Oxides for Ultrathin Gate Dielctric Applications, SPIE 1998 Symp. Microelec. Manuf./Sep. 1998/Santa Clara, CA.

Song et al., Ultra Thin (<20Å) CVD $Si_3N_4$ Gate Dielectric for Deep–Sub–Micron CMOS Devices.

Lee et al., Enhancement of PMOS Device Performance with Poly–SiGe Gate, IEEE Electronic Device Letters, vol. 20, No. 5, May 1999, p. 232–234.

Tseng et al., Reduced Gate Leakage Current and Boron Penetration of 0.18 $\mu$m 1.5 V MOSFETs Using Integrated RTCVD Oxynitride Gate Dielectric.

Ponomarev et al., High–Performance Deep SubMicron CMOS Technologies with Polycrystalline–SiGe Gates, IEEE Electronic Device Letters, vol. 47, No. 4, Apr. 2000, p. 848–855.

Robinson, Oxide–deposition step bumps flash performance, www.eetimes.com/news/97/940/news/oxide.html, Apr. 21, 2000.

* cited by examiner

METHOD OF MAKING BIPOLAR TRANSISTOR SEMICONDUCTOR DEVICE INCLUDING GRADED, GROWN, HIGH QUALITY OXIDE LAYER

RELATED APPLICATIONS

This application is based upon copending provisional application Nos. 60/140,666 and 60/140,909both filed June 24, 1999, the entire disclosures of which are incorporated herein by reference.

FIELD OF THE INVENTION

The present invention relates to the field of semiconductors, and, more particularly, to bipolar transistors and associated manufacturing methods.

BACKGROUND OF THE INVENTION

Semiconductor devices in the form of integrated circuits are widely used in most electronic devices. For example, computers, cellular telephones, and other similar devices typically include one or more integrated circuits (ICs). In addition, many typical types of ICs are based upon metal-oxide semiconductor (MOS) technology wherein each transistor includes doped regions in a semiconductor substrate.

A bipolar transistor or bipolar junction transistor (BJT) is a semiconductor device commonly used for amplification. The device can amplify analog or digital signals. It can also function as an oscillator. Physically, a bipolar transistor amplifies current, but it can be connected in circuits designed to amplify voltage or power. Bipolar transistors are formed from the junction of three pieces of doped silicon called the emitter, collector and base. There are two major types of bipolar transistors, called PNP and NPN. A PNP transistor has a layer of N-type semiconductor between two layers of P-type material. An NPN transistor has a layer of P-type material between two layers of N-type material. In P-type material, electric charges are carried mainly in the form of electron deficiencies called holes. In N-type material, the charge carriers are primarily electrons.

The bipolar transistor has advantages and disadvantages relative to the FET (field-effect transistor). Bipolar devices can switch signals at high speeds, and can be manufactured to handle large currents so that they can serve as high-power amplifiers in audio equipment and in wireless transmitters. Bipolar devices are not especially effective for weak-signal amplification, or for applications requiring high circuit impedance. A single IC can contain many thousands of bipolar transistors, along with other components such as resistors, capacitors, and diodes.

More specifically, a typical bipolar transistor includes a thin insulating layer of silicon oxide formed over the emitter, base and collector regions to separate the respective contacts or electrodes. The contacts may be a metal or doped polysilicon layer, for example.

As device dimensions have been reduced in semiconductor processing, the quality of this oxide layer has become even more important. A preferred approach to forming the oxide may be by thermal oxidation. The thermally grown oxide provides good electrical performance, provides good mechanical bonding to the underlying silicon substrate portion, and helps to block unwanted ion implantation and diffusion of dopants into the substrate.

U.S. Pat. No. 5,869,405 to Gonzalez et al. discloses in situ rapid thermal etching and oxidation to form an oxide. In particular, an oxidation step is followed by an etch step to remove contamination and damage from the substrate. Repeated in situ oxidation and etch steps may be used until a desired removal of contamination or silicon damage is achieved.

U.S. Pat. No. 5,81,892 to Lojek et al. discloses a method for making an oxide including both pre- and post-oxidation anneal steps. The patent provides that the anneals, the ambients selected, and various cleaning steps help ensure a high quality oxide. A portion of the oxide layer grown during the high temperature (1000° C.) anneal and subsequent cool down is desirably reduced to less than about 20 Å, and its growth is the necessary byproduct of incorporating oxygen into the oxide bulk for the benefit of improving electrical performance.

As device dimensions scale down rapidly with the advance of manufacturing technologies, the electric field in the thin oxides continues to increase. Part of the consequence of such increased electric field and the thinning of the oxides is the increased trap generation at the oxide interface or within the thin oxides. The trap generation and the capture of channel electrons by the traps in turn leads to increased low frequency noise and transconductance degradation. Additionally, the emitter-base breakdown voltage may result in hot carrier aging (HCA) of the adjacent oxide and thus affect the gain of the device.

Unfortunately, despite continuing efforts and developments in the area of forming high quality oxides, device performance and longer term reliability is still compromised by conventional oxides, especially as device dimensions continue to be reduced.

SUMMARY OF THE INVENTION

In view of the foregoing background, it is therefore an object of the present invention to provide a bipolar transistor semiconductor device including a high quality oxide layer and a method for making the device.

This and other objects, features and advantages in accordance with the present invention are provided by a method of making a bipolar transistor including forming respective emitter, base and collector regions in a silicon substrate, and forming an oxide layer adjacent the silicon substrate. The oxide layer is formed by growing a first oxide portion by upwardly ramping the silicon substrate to a first temperature lower than a glass transition temperature, and exposing the silicon substrate to an oxidizing ambient at the first temperature and for a first time period, and growing a second oxide portion between the first oxide portion and the silicon substrate by exposing the silicon substrate to an oxidizing ambient at a second temperature higher than the glass transition temperature for a second time period so that the second oxide portion has a thickness in a range of about 2 to 75% of a total thickness of the oxide layer. Also, respective contacts for the emitter, base and collector regions are formed.

The step of upwardly ramping may comprise upwardly ramping the temperature at a relatively high ramping rate to reduce any oxide formed during the upward ramping, and the relatively high ramping rate may be greater than about 35° C./minute. The step of growing the first oxide portion may further comprise exposing the silicon substrate to an oxidizing ambient containing a relatively small amount of oxygen during the upward ramping to reduce any oxide formed during upward ramping, and the relatively small amount of oxygen may be less than about 10%.

The step of upwardly ramping may comprise upwardly ramping at a relatively high rate and in an ambient so that an oxide thickness formed during the upward ramping is in a range of about 5 to 30% of the total thickness of the oxide layer. Also, the first temperature may be less than about 900° C., and the second temperature may be greater than about 925° C. Furthermore, the first temperature may be in a range of about 750° C. to 900° C., and the second temperature may be in a range of about 925° C. to 1100° C. The growing steps may be carried out in a single processing apparatus such as a furnace, a rapid thermal processor, or a fast thermal processor.

Objects, features and advantages in accordance with the present invention are also provided by a semiconductor device including a plurality of bipolar transistors formed on a silicon layer, wherein each bipolar transistor includes a graded, grown, oxide layer on the silicon layer and comprising a first portion and a second portion arranged in stacked relation with the second portion being adjacent the silicon layer and defining an interface therewith, the second portion having a thickness in a range of about 2 to 75% of a total thickness of the oxide layer, the silicon layer and the oxide layer being substantially stress-free adjacent the interface. Respective emitter, base and collector regions are in the silicon layer, and respective contacts for the emitter, base and collector regions are provided.

The interface may be substantially planar and may have a roughness of less than about 3 Angstroms. The silicon layer may comprise single crystal silicon and may be a silicon substrate.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
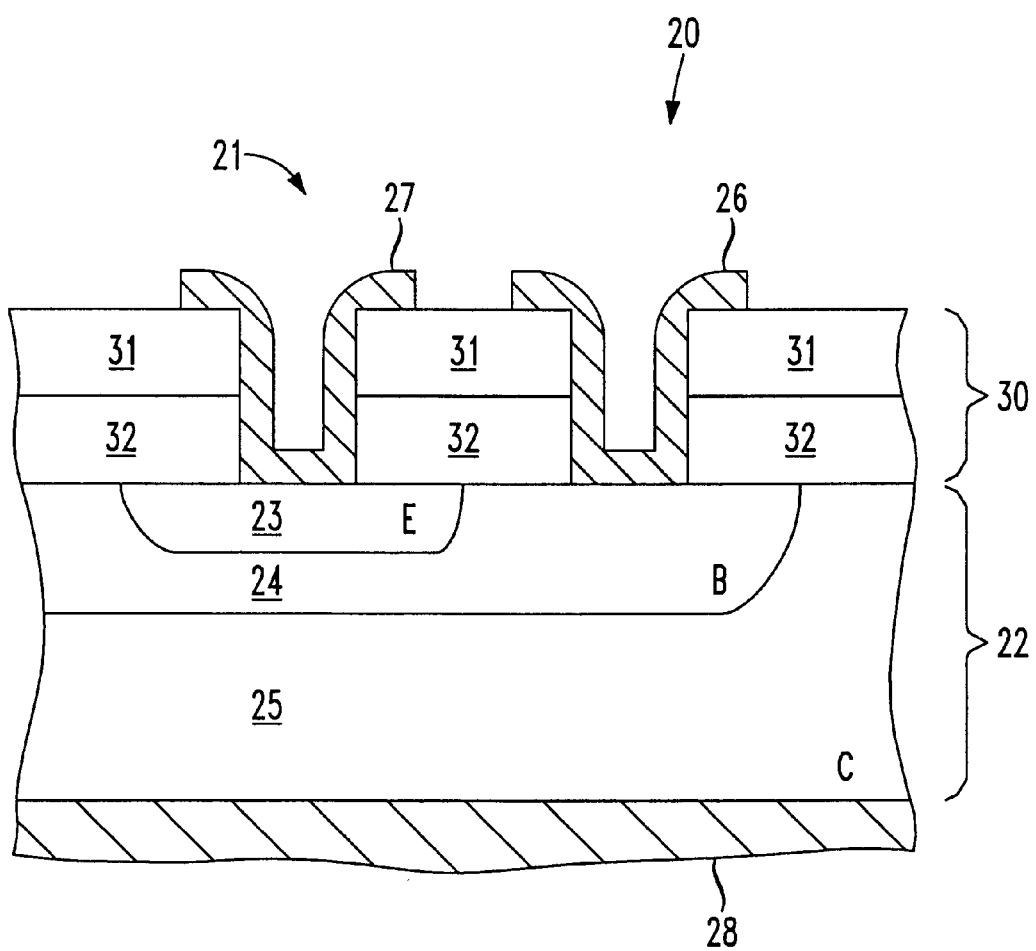
FIG. 1 is a schematic cross-sectional view of a portion of an integrated circuit illustrating a bipolar transistor including an oxide in accordance with the present invention.

Referring initially to FIG. 1, a bipolar transistor 21 including the high quality oxide layer 30 in accordance with the present invention is first described. The bipolar transistor 21 may be part of a semiconductor device 20 as will be readily appreciated by those skilled in the art.

The bipolar transistor 21 includes differently doped emitter, base and collector regions 23, 24 and 25 which may be formed in the silicon semiconductor substrate 22 by conventional semiconductor fabrication techniques which require no further discussion herein. The oxide layer 30, in accordance with the invention, overlies the emitter, base and collector regions 23, 24 and 25. The oxide layer 30 includes a first portion 31 and a second portion 32 arranged in stacked relation. Portions of the oxide layer 30 have been removed and respective contacts 26, 27 for the emitter and base regions 23, 24 have been formed therein. Furthermore, contact 28 for the collector region 25 is provided, for example, on an opposite surface of the substrate 22. The contacts 26, 27 and 28 may be a metal or doped polysilicon layer, for example, as would be appreciated by the skilled artisan. The oxide layer 30 provides the desired electrical characteristics in terms of a low interface trap site density, resistance to hot carrier aging, and improved time dependent dielectric breakdown (TDDB), for example.

The wear out behavior is 5 to 15 times longer than for conventional oxides. The TDDB for an oxide having a thickness of about 50 Å, for example, subject to an accelerated stress test of a 2.5 to 7.5 Megavolt field at 150° C. provides a 50% failure rate equivalent to 25 years of normal operation. For a conventional oxide, the TDDB would likely be in the range of about 1–10 years. Accordingly, the present invention overcomes the domesday prediction of others relating to the downward scaling of the oxide layers as device dimensions continue to be reduced.

One method for making a graded oxide layer 30 includes the steps of: growing a first oxide portion 31 by upwardly ramping the silicon substrate 22 to a first temperature lower than a glass transition temperature, and exposing the silicon substrate to an oxidizing ambient at the first temperature and for a first time period; and growing a second oxide portion 32 between the first oxide portion and the silicon substrate by exposing the silicon substrate to an oxidizing ambient at a second temperature higher than the glass transition temperature for a second time period. In one embodiment the first and second oxide portions are grown so that the second oxide portion 32 has a thickness in a range of about 2 to 75% of a total thickness of the graded oxide layer 30. The oxidizing ambient may be a dry oxidizing ambient, for example. In other embodiments, a wet oxidizing ambient may be used as will also be appreciated by those skilled in the art.

The method produces an oxide layer 30 having first and second graded portions 31, 32 with greatly reduced stress in the area adjacent the interface between the substrate 22 and the oxide layer, and substantially higher reliability.

One aspect of the invention relates to the step of upwardly ramping the temperature at a relatively high ramping rate to reduce any oxide formed during the upward ramping. For example, the relatively high ramping rate may be greater than about 35° C./minute, although much faster rates are also possible. In addition, the step of growing the first oxide portion 31 may further comprise exposing the silicon substrate 22 to an oxidizing ambient containing a relatively small amount of oxygen during the upward ramping to alternately or additionally reduce any oxide formed during upward ramping. For example, the relatively small amount of oxygen may be less than about 10%, although even smaller percentages may also be used. The step of upwardly ramping may also comprise upwardly ramping at the relatively high rate and in the ambient so that an oxide thickness formed during the upward ramping is in a range of about 5 to 30%, or less than about 30%, of the total thickness of the graded oxide layer. For example, for an oxide layer 30 thickness of about 50 Å, the initial or ramp portion of oxide may be 2–15 Å in thickness.

The total thickness of the graded oxide layer 30 may be less than about 50 Å for an ultrathin oxide, for example. The first temperature may be less than about 900° C., and the second temperature may be greater than about 925° C. More particularly, the first temperature may be in a range of about 750° C. to 900° C.; and the second temperature may be in a range of about 925° C. to 1100° C.

The first oxide portion 31 may further comprise an uppermost nitrided portion, for example, not shown. The nitride portion serves to block dopant penetration into the oxide layer 30 as will be readily understood by those skilled in the art. The growing steps may be carried out in a single processing apparatus in one embodiment of the invention. In another embodiment, the second oxide portion 32 may be added to a pregrown or predeposited first oxide portion 31, for example. The single processing apparatus may be one of a furnace, a rapid thermal processor, and a fast thermal processor, for example.

Figure 2:
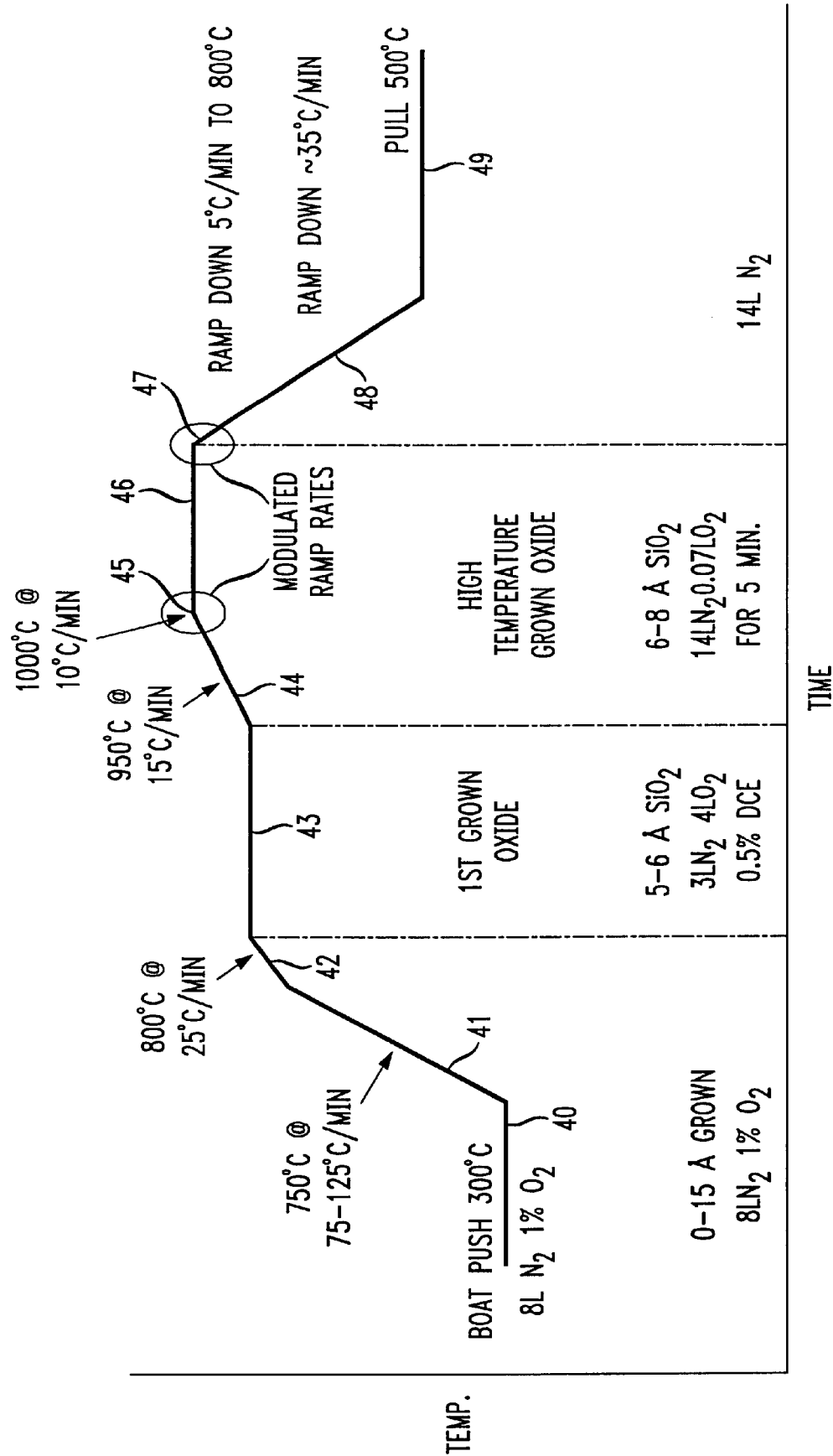
FIG. 2 is a graph of temperature versus time for growing the oxide layer in accordance with a first embodiment of the present invention.

Referring now more particularly to FIG. 2, one sequence for making a graded oxide layer 30 by fast thermal processing (FTP) is now described. Segment 40 indicates a wafer boat push step at a temperature of 300° C., a flow of nitrogen of 8 L and 0.1 to 1% oxygen. The same flows are maintained as the temperature is ramped upwardly at 75° C. to 125° C./minute to about 750° C. (segment 41), and then ramped more slowly at 25° C./minute to about 800° C. (segment 42) for better thermal stabilization.

Segment 43 has a nitrogen flow of 3 to 5 L, oxygen flow at 2 to 4 L, and dichloroethylene (DCE) is added at 0 to 0.5% for a time that is dependent upon the desired thickness as will be readily appreciated by those skilled in the art. For example, in segments 40–42 an oxide thickness in a range of 0–15 Å may be grown, and for the segment 43 about 5–6 Å of oxide may be grown.

Segment 44 is an upward temperature ramp to 950° C. at a rate of about 15° C./minute with a nitrogen flow of 14 L, and an oxygen flow of 0.07 L for about 5 minutes, for example. Segment 45 is a modulated upward ramp segment at about 10° C./minute to 1000° C. with the same flows as segment 45. The temperature of 1000° C. is maintained at segment 46 in a 0.5 to 50% oxygen ambient for a desired time so that an additional 6–8 Å of oxide may be grown at the high temperature.

Segment 47 represents a temperature ramp down with a rate of about 5° C./minute to a temperature of about 800° C. with only a nitrogen flow of 14 L. The modulated cooling at the relatively slow rate downward to below the glass transition temperature is believed to further relieve stress in the oxide layer 30. Segment 48 represents a further ramp down at a faster rate of about 35° C./minute and segment 49 is the boat pull at about 500° C. with the nitrogen flow at 14 L.

Figure 3:
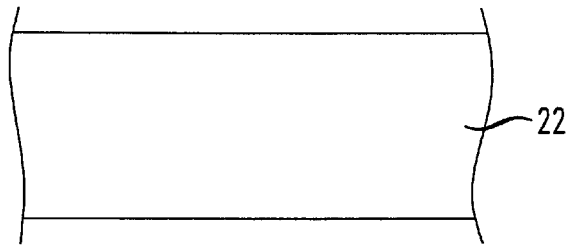
FIGS. 3–5 are schematic cross-sectional views illustrating making of the oxide layer in accordance with the present invention.
Figure 4:
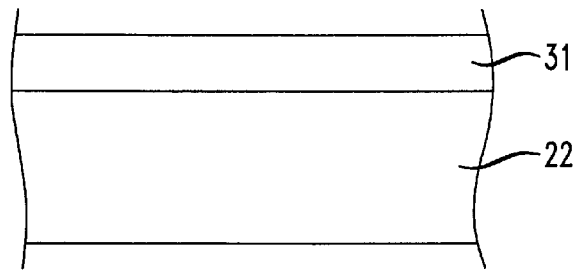
Figure 5:
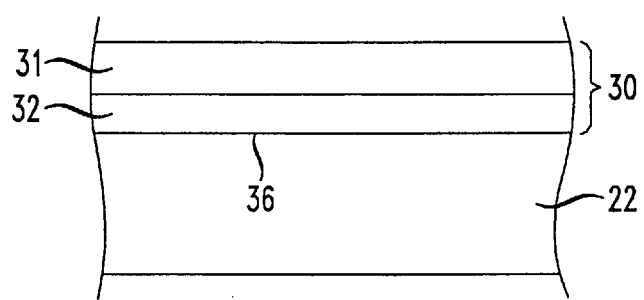

Referring now briefly to FIGS. 3–5, the steps of forming the oxide layer 30 are further illustrated. The substrate 22 (FIG. 3) is heated under the ambient conditions as mentioned above to produce the first oxide portion 31 as shown in FIG. 4. Continuing the heating and processing above the glass transition temperature as also described above produces the oxide layer 30 on the substrate 22 as shown in FIG. 5, and wherein the oxide layer includes first and second graded portions 31, 32. In particular, the first portion 31 may be considered the low temperature portion, that is, formed primarily below about 900° C. The second portion 32 may be considered the high temperature portion which is grown at a temperature of 925° C. to 1100° C. and which may have a thickness of 2–75% of the total thickness of the oxide layer 30. This second portion 32 provides an Si—$SiO_2$ interface 36 that is relatively planar and wherein the adjacent oxide and silicon portions are relatively stress free. Applicants theorize without wishing to be bound thereto that the formation of the first oxide portion 31 below the glass transition temperature, and the formation of the second portion 32 with the modulation of the heating and cooling near the upper temperature provides the stress relieved oxide layer 30.

Figure 6:
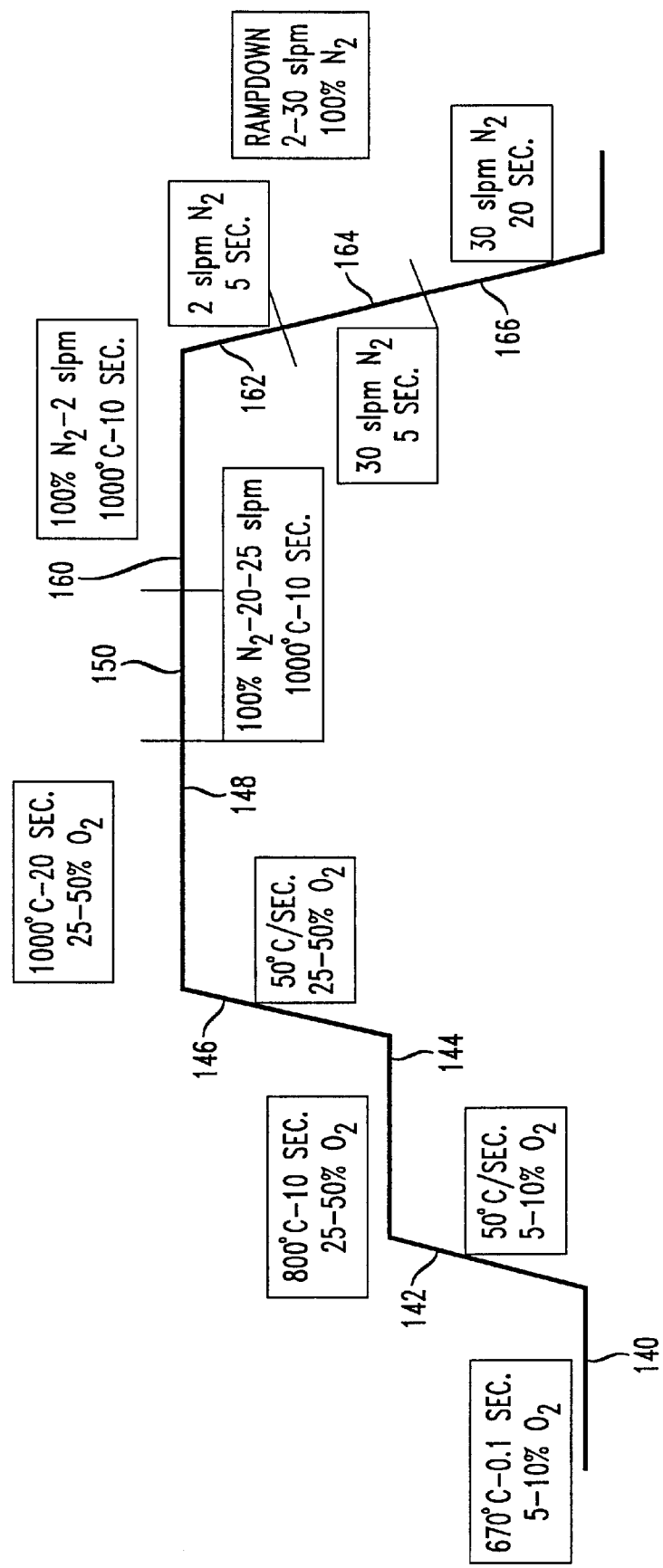
FIG. 6 is a graph of temperature versus time for growing the oxide layer in accordance with a second embodiment of the invention.

Turning now to FIG. 6, a rapid thermal processing (RTP) approach to forming the graded oxide layer 30 is now described. In the first horizontal segment 140, the temperature is 670° C. with a 5 to 10% oxygen ambient. Next, in the second segment 142, the temperature is rapidly ramped upward at 50° C./sec. in an ambient containing 5 to 10% oxygen. The first oxide portion 31 is grown primarily at the third segment 144 wherein the temperature is maintained at about 800° C. in a 25 to 50% oxygen ambient, for about 10 sec. A second upward ramp is performed at segment 146 at a rate of about 50° C./sec. to the temperature above the glass transition temperature at segment 148 and for a time of about 20 sec.

At segment 150 the substrate 22 and oxide layer 30 are subjected to a 100% nitrogen flow of 20 to 25 slpm for about 5 sec., then at segment 160 to a 100% nitrogen flow at a rate of about 2 slpm for about 10 sec. At segment 162 the temperature is ramped downward with a nitrogen flow of about 2 slpm for about 5 sec., then at 30 slpm for about 5 sec. at segment 164, and lastly at segment 166 for about 20 sec. at a 30 slpm flow rate. The temperature ramp down may be at greater than about 25° C./min., for example. Those of skill in the art will appreciate that these times, rates, and other parameters are illustrative of the invention only, and that other values may also be used.

Historically, thermal processing steps during wafer fabrication have been carried out in a furnace. A furnace relies on equilibrium heat transfer conditions to ensure uniform heating of wafers placed therein. This limits the rate of temperature rise in the furnace due to limitations governing uniform heat transfer across each wafer placed in the furnace. Rapid thermal processing (RTP), on the other hand, operates in an inherently transient mode where the various components of the reactor are not in thermal equilibrium with each other. RTP relies on the ability to heat the wafer fast enough that the heat transfer coupling is selective to the wafer relative to other reactor components. This calls for a cold wall reactor that has sufficient thermal mass (or cooling) such that the heat dissipation is limited and the reactor conditions remain constant over a period of time as will be readily appreciated by those skilled in the art.

Traditionally, difficulties in controlling the power coupling between the wafer and other reactor components, limiting the heat loss from the edge of the wafer, emissivity variations, and poor temperature sensing and control equipment have all limited RTP's ability to compete with furnaces on the basis of temperature uniformity and control, and stability. However, in recent years, improvements in temperature sensing, reactor design, and innovative pyrometry techniques which account for emissivity variations have established RTP as a viable alternative to all thermal processes that were once considered the domain of furnaces.

In order to combine the best features of furnaces and RTPs, the Fast Thermal Processor (FTP) has been developed. The FTP uses a standard vertical furnace configuration with a batch size of up to 100 wafers and enhanced heating and cooling capability to achieve ramp rates up to 100° C./min. Characteristic property of these furnaces equipped with the advanced heater element is that the surface load on the furnace walls is much higher than with metallic elements. This is due to the higher operating temperature of the heater element. The above reduces the heating time considerably. The wall loading is also dependent upon the placement of elements on the wall (along the walls or perpendicular thereto). This improved furnace hardware increases the ramp-up (heating) and ramp down (cooling) rates to reduce overall processing time and cost of ownership.

Both FTPs and RTPs have very good ambient temperature control resulting in minimum native oxide growth and slip dislocation generation during rapid ramp-up and ramp-down of the temperature. This is important for an ultrathin oxide (<50 Å) as the ramp oxide degrades electrical characteristics of the oxide and the silicon/oxide interface. For FTPs typically a ramp-up rate of 50–100° C./min. is used in a mildly oxidizing (0.05–0.5% $O_2$) ambient during ramp-up to incur minimum (<10 Å) ramp oxide growth prior to the first oxidation step at 750–900° C. to grow about 50–75% of the total oxide thickness.

Thermal process sequence and ambient control by RTP are similar to that of FTP, except a ramp rate of 50–150° C./sec. is typically used on a single wafer rather in a batch. The final part of the synthesis involves growing the final oxide at a temperature above the glass visco elastic transition temperature (about 925° C.) under the first grown layer in an oxidizing ambient of 0.5–50% oxygen to generate about 25–50% of the total oxide thickness, which is typically below about 50 Å. This concept of grading, however, is not limited to ultrathin oxides, but can also be used for oxides greater than about 50 Å and for interlevel oxides. For thicker oxides conventional furnaces can be used as ramp oxides plays a relatively minor role. Ramp down is done in an inert ambient typically 10–50° C./min for FTP and 10–50° C./sec for RTP. This graded grown oxide allows stress relaxation in the first grown layer while retaining an excellent silicon/oxide interface substructure formed at high temperature above the glass transition temperature.

Figure 7:
FIG. 7 is a transmission electron microscope (TEM) lattice image of a conventional oxide layer on a substrate and further including a conductive layer on the oxide as in the prior art.

Reliability problems for conventional oxide technology are increasingly important as oxide thickness are reduced to around and/or below about 50 Å. New submicron technologies of 0.16 and 0.12 μm may require a oxide with a thickness below about 25 Å. Many believe that such relatively thin oxides present an insurmountable problem with existing technologies. However, the present invention overcomes the perceived difficulties primarily by addressing stress in the oxide and substrate adjacent the interface. For example, FIG. 7 is a TEM lattice image of a conventionally grown oxide 60 on a silicon substrate 62, and with a conductive polysilicon layer 56 on the oxide. A stress band 63 (dark contrast) is clearly evident in the crystalline lattice of the silicon substrate 62 at the interface region. Stress also exists in the oxide layer 60; however, the stress band is not visible using the TEM Si(111) lattice image since the oxide layer 60 is amorphous as will be readily appreciated by those skilled in the art. In addition, the $SiO_2$ interface is relatively rough as will be seen with subsequent comparison to the oxide layer 30 of the present invention.

In general, Applicants theorize that the stress is due to a mismatch of expansion coefficients which are fixed for a particular oxidation temperature (Tox). The stress generated due to the growth condition is a net result of two competing processes: (1) a decrease in viscosity of the $SiO_2$ with an increase in Tox above the glass transition temperature (Tc), and (2) structural relaxation that increases the viscosity. In accordance with one aspect of the present invention modulating the ramp rate near Tc thereby relaxes the stress on a pregrown $SiO_2$ portion 31.

Figure 8:
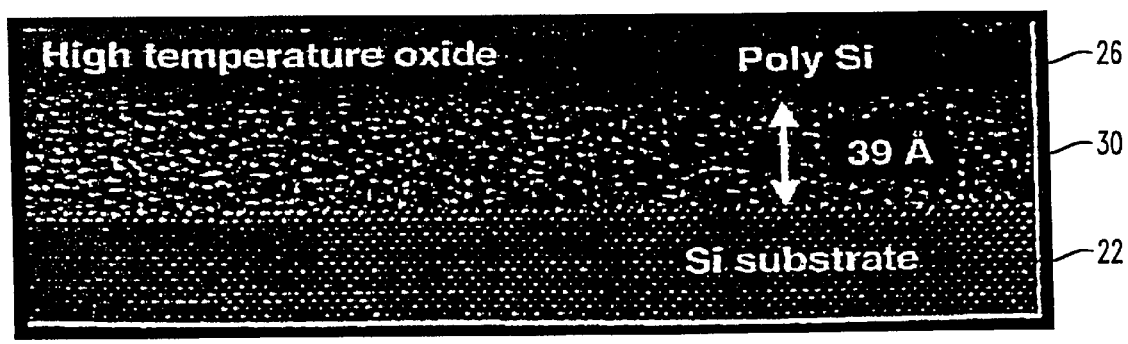
FIG. 8 is a transmission electron microscope (TEM) lattice image of an oxide layer on a substrate and further including a conductive layer on the oxide in accordance with the present invention.

Preliminary carrier concentration profiling under the channel of relevant dopants (Phosphorous and Boron) indicated that the present invention does not change the threshold voltage compared to conventional processing sequences. More particularly, as shown in the TEM lattice image of FIG. 8, there is no stress band (dark contrast) as in the conventionally grown oxide as shown in FIG. 7. Instead the interface between the oxide layer 30 and the silicon substrate 22 is substantially stress free. The oxide portions 31, 32 are also substantially stress free. In addition, the interface is also substantially planar with a planarity that can typically be less than about 3 Å.

Although the two graded portions 31, 32 are not visible in the amorphous oxide layer 30, those of skill in the art will recognize that other conventional analysis tools may be used to detect the two different portions. For example, backscattering techniques may be used to detect the two graded portions 31, 32 of the oxide layer 30.

Thus, an improved oxide layer 30 is provided and has the desired electrical characteristics in terms of a low interface trap site density, resistance to hot carrier aging, and improved time dependent dielectric breakdown (TDDB), for example.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method of making a bipolar transistor comprising:
   forming respective emitter, base and collector regions in a silicon substrate;
   forming an oxide layer adjacent the emitter, base and collector regions in the silicon substrate by
      growing a first oxide portion by upwardly ramping the silicon substrate to a first temperature lower than a glass transition temperature of the oxide, and exposing the silicon substrate to an oxidizing ambient at the first temperature and for a first time period, and
      growing a second oxide portion between the first oxide portion and the silicon substrate by exposing the silicon substrate to an oxidizing ambient at a second temperature higher than the glass transition temperature for a second time period so that the second oxide portion has a thickness in a range of about 2 to 75% of a total thickness of the oxide layer; and
   forming respective contacts for the emitter, base and collector regions.

2. A method according to claim 1 wherein the step of upwardly ramping comprises upwardly ramping the temperature at a relatively high ramping rate to reduce any oxide formed during the upward ramping.

3. A method according to claim 2 wherein the relatively high ramping rate is greater than about 35° C./minute.

4. A method according to claim 1 wherein the step of growing the first oxide portion further comprises exposing the silicon substrate to an oxidizing ambient containing a relatively small amount of oxygen during the upward ramping to reduce any oxide formed during upward ramping.

5. A method according to claim 4 wherein the relatively small amount of oxygen is less than about 10%.

6. A method according to claim 1 wherein the step of upwardly ramping comprises upwardly ramping at a relatively high rate and in an ambient so that an oxide thickness formed during the upward ramping is in a range of about 5 to 30% of the total thickness of the oxide layer.

7. A method according to claim 1 wherein the first temperature is less than about 900° C.; and wherein the second temperature is greater than about 925° C.

8. A method according to claim 1 wherein the first temperature is in a range of about 750° C. to 900° C.; and wherein the second temperature is in a range of about 925° C. to 1100° C.

9. A method according to claim 1 wherein the growing steps are carried out in a single processing apparatus.

10. A method according to claim 9 wherein the single processing apparatus comprises one of a furnace, a rapid thermal processor, and a fast thermal processor.

11. A method of making a bipolar transistor comprising:
forming respective emitter, base and collector regions in a silicon substrate;
forming an oxide layer adjacent the silicon substrate by growing a first oxide portion by upwardly ramping the silicon substrate at a relatively high rate to a first temperature lower than a glass transition temperature and in an ambient so that any oxide formed during the upward ramping is less than about 30% of a total thickness of the oxide layer, and exposing the silicon substrate to an oxidizing ambient at the first temperature and for a first time period, and growing a second oxide portion between the first oxide portion and the silicon substrate by exposing the silicon substrate to an oxidizing ambient at a second temperature higher than the glass transition temperature for a second time period; and forming respective contacts for the emitter, base and collector regions.

12. A method according to claim 11 wherein the step of growing the second oxide portion comprises growing the second oxide portion to have a thickness in a range of about 2 to 75% of the total thickness of the oxide layer.

13. A method according to claim 11 wherein the first temperature is less than about 900° C.; and wherein the second temperature is greater than about 925° C.

14. A method according to claim 11 wherein the first temperature is in a range of about 75° C. to 900° C.; and wherein the second temperature is in a range of about 925° C. to 1100° C.

15. A method according to claim 11 wherein the growing steps are carried out in a single processing apparatus.

16. A method according to claim 15 wherein the single processing apparatus comprises one of a furnace, a rapid thermal processor, and a fast thermal processor.

* * * * *